(12) United States Patent
Uebelein et al.

(10) Patent No.: US 8,966,825 B2
(45) Date of Patent: Mar. 3, 2015

(54) DOOR MODULE WITH INTEGRATED SENSOR ELECTRODE

(71) Applicant: Brose Fahrzeugteile GmbH & Co. KG, Hallstadt, Hallstadt (DE)

(72) Inventors: Joerg Uebelein, Grub am Forst (DE); Oscar Mauricio Ayala Guzman, Curitiba (BR); Christian Thomann, Burgebrach (DE); Christian Hermann, Coburg (DE)

(73) Assignee: Brose Fahrzeugteile GmbH & Co. KG, Hallstadt, Hallstadt (DE)

( * ) Notice: Subject to any disclaimer, the term of this patent is extended or adjusted under 35 U.S.C. 154(b) by 0 days.

(21) Appl. No.: 14/184,981

(22) Filed: Feb. 20, 2014

(65) Prior Publication Data
US 2014/0167445 A1    Jun. 19, 2014

Related U.S. Application Data

(63) Continuation of application No. PCT/EP2012/003476, filed on Aug. 16, 2012.

(30) Foreign Application Priority Data

Aug. 20, 2011 (DE) .......................... 10 2011 111 209

(51) Int. Cl.
*B60J 5/04* (2006.01)
*H03K 17/955* (2006.01)
*H03K 17/96* (2006.01)

(52) U.S. Cl.
CPC ............. *B60J 5/0416* (2013.01); *H03K 17/955* (2013.01); *H03K 17/962* (2013.01); *H03K 2017/9613* (2013.01)
USPC ................................ 49/502; 49/25

(58) Field of Classification Search
USPC .................. 49/348, 349, 25, 502; 296/146.2; 200/600, 512; 340/562, 686.1
See application file for complete search history.

(56) References Cited

U.S. PATENT DOCUMENTS

| | | | | |
|---|---|---|---|---|
| 4,376,879 A | * | 3/1983 | Nagata et al. ................. | 200/314 |
| 5,760,554 A | * | 6/1998 | Bustamante .................. | 318/280 |
| 6,139,088 A | * | 10/2000 | Okamoto et al. .......... | 296/146.6 |
| 6,409,250 B1 | * | 6/2002 | Schultheiss ................ | 296/146.7 |
| 6,723,933 B2 | * | 4/2004 | Haag et al. ................. | 200/61.42 |
| 6,724,324 B1 | * | 4/2004 | Lambert ......................... | 341/33 |
| 6,750,624 B2 | * | 6/2004 | Haag et al. ..................... | 318/467 |
| 6,774,789 B2 | | 8/2004 | Inaba et al. | |
| 6,857,688 B2 | * | 2/2005 | Morrison et al. .......... | 296/146.7 |
| 7,002,089 B2 | * | 2/2006 | Stevenson ..................... | 200/512 |

(Continued)

FOREIGN PATENT DOCUMENTS

| | | |
|---|---|---|
| DE | 601 14 116 T2 | 7/2006 |
| DE | 11 2006 000 637 T5 | 2/2008 |

(Continued)

*Primary Examiner* — Katherine Mitchell
*Assistant Examiner* — Justin Rephann
(74) *Attorney, Agent, or Firm* — Muncy, Geissler, Olds & Lowe, P.C.

(57) ABSTRACT

A door module for a door of a motor vehicle. The door module has a support for receiving a window lifter drive and fixing points at which the door module can be fixed to the corresponding door. At least one sensor electrode of a capacitive and/or inductive control device is attached to the support in order to contactlessly operate an actuator in the motor vehicle.

11 Claims, 6 Drawing Sheets

(56) References Cited

U.S. PATENT DOCUMENTS

| | | | |
|---|---|---|---|
| 7,198,319 B2* | 4/2007 | Schroder et al. | 296/146.7 |
| 7,260,454 B2* | 8/2007 | Pickering et al. | 701/2 |
| 7,410,202 B2* | 8/2008 | Rose et al. | 296/146.2 |
| 7,958,672 B2 | 6/2011 | Ishihara | |
| 2005/0205407 A1* | 9/2005 | Hein et al. | 200/600 |
| 2007/0006536 A1* | 1/2007 | Youngs et al. | 49/502 |
| 2007/0068790 A1* | 3/2007 | Yerdon et al. | 200/600 |
| 2007/0284945 A1* | 12/2007 | Hein | 307/10.8 |
| 2008/0140282 A1* | 6/2008 | Ando | 701/36 |
| 2008/0202912 A1* | 8/2008 | Boddie et al. | 200/600 |
| 2008/0257706 A1* | 10/2008 | Haag | 200/600 |
| 2008/0276541 A1* | 11/2008 | Roy et al. | 49/502 |
| 2009/0056230 A1* | 3/2009 | Flendrig | 49/502 |
| 2009/0145035 A1* | 6/2009 | Mangold et al. | 49/352 |
| 2009/0160211 A1* | 6/2009 | Krishnan et al. | 296/146.4 |
| 2010/0079283 A1* | 4/2010 | Hammerschmidt et al. | 340/562 |
| 2011/0012623 A1* | 1/2011 | Gastel et al. | 324/686 |
| 2011/0308163 A1* | 12/2011 | Roy et al. | 49/352 |
| 2012/0049870 A1* | 3/2012 | Salter et al. | 324/686 |
| 2012/0279843 A1* | 11/2012 | Wippler | 200/600 |
| 2013/0061679 A1* | 3/2013 | Steckel | 73/632 |
| 2013/0291439 A1* | 11/2013 | Wuerstlein et al. | 49/357 |
| 2014/0069015 A1* | 3/2014 | Salter et al. | 49/31 |

FOREIGN PATENT DOCUMENTS

| | | |
|---|---|---|
| DE | 10 2006 059 208 A1 | 6/2008 |
| DE | 20 2008 006 499 U1 | 9/2009 |
| EP | 1 212 206 B1 | 8/2004 |

* cited by examiner

DOOR MODULE WITH INTEGRATED SENSOR ELECTRODE

This nonprovisional application is a continuation of International Application No. PCT/EP2012/003476, which was filed on Aug. 16, 2012, and which claims priority to German Patent Application No. DE 10 2011 111 209.3, which was filed in Germany on Aug. 20, 2011, and which are both herein incorporated by reference.

BACKGROUND OF THE INVENTION

1. Field of the Invention

The present invention relates to a door module for a (side) door of a motor vehicle, with a support for receiving a window lifter drive and with fixing points at which the door module can be fixed to the corresponding door.

2. Description of the Background Art

Such a door module is known, for example, from EP 1 212 206 B1.

A door module in modern motor vehicles is typically inserted between the door body, consisting of a metal plate, and the inside door panel. The support for such a door module, which often is a large plastic part, supports frequently still other functional components in addition to the window lifter drive, in particular control electronics for controlling the window lifter. Furthermore, such a door module frequently has installation openings for onboard loudspeakers and is used for cable routing for the electrical supply and signal lines run within the door.

In particular, the use of a door module has the advantage that the door module with all functional components mounted thereupon can be pre-installed, for example, by a vehicle supplier, and optionally also wired and tested. The pre-installed door module is typically fixed in its entirety to the door body during the final vehicle assembly, which significantly simplifies and accelerates the final vehicle assembly.

Nevertheless, the degree of prefabrication achievable by means of such a door module is often limited by the structural conditions of the door. Thus, for example, control buttons, as they are provided typically on the door for operating the window lifter, for adjusting the mirrors, etc., are often mounted only after the installation of the inside door panel and are electrically contacted with the associated functional components on the door module; this can be associated with considerable effort, especially in view of the often confined spatial relationships.

SUMMARY OF THE INVENTION

It is therefore an object of the present invention to provide is to make the fabrication of a motor vehicle door still more efficient.

The door module comprises a support, which is configured at least for receiving a window drive, or in which such a window lifter drive is already mounted. The door module comprises furthermore fixing points at which the door module can be or is already fixed to the corresponding (side) door of the motor vehicle. According to the invention, at least one sensor electrode of a control device, which is used for the non-contact operation of an actuator in the motor vehicle, is attached to or inserted in this support.

"Actuator" can generally be used to describe a structural element that converts an input parameter into a different output parameter in order to produce a desired effect. The input parameter in this case is especially an electronic control signal. The output parameter can be a mechanical motion. In this case, the actuator is formed, for example, by an electric motor or comprises at least one such motor. A typical example of such an actuator is the window lifter drive mounted on the support. The output parameter, however, can also be another physical quantity, e.g., pressure, temperature, fluid flow, sound, or light.

The control device can be formed as a capacitive proximity sensor, which detects the approach of an object (particularly a body part of a vehicle user) via the interaction of the object with an electric field generated by the sensor electrode. It is basically possible within the scope of the invention to provide a control device, based on an inductive (magnetic) or an electromagnetic detection principle, within the frame of the door module.

In this regard, the invention can be based on the premise that it is advantageous to replace the electromechanical switch typically provided within the frame of a (side) door of a vehicle as a control element for the window, mirror adjustment, etc., by capacitive and/or inductive proximity sensors. An advantage of such proximity sensors is that said proximity sensors detect without contact, i.e., already detect a command-issuing body part of a vehicle user, when said body part is still located at a distance (different from zero) from the proximity sensor (more precisely, a sensor electrode of the same).

This property makes it possible, as has been realized, to "conceal" the sensor electrode, provided as the control element, under the inside door panel, namely, to dispose it on the back, facing the vehicle interior, of the interior door panel. This again makes it possible, as has been realized, to attach the sensor electrode to the door module even before the assembly of the door module, as a result of which a further increase in efficiency during door assembly is achieved.

To reduce the risk that the sensor electrode is damaged or slips before or during the assembly of the door module, the sensor electrode is preferably connected integrally with the support. "Integrally" here means that the sensor electrode is connected by material bonding with the support and in particular cannot be separated from the support without destruction.

In particular, the sensor electrode in an embodiment of the invention is made from a film or a metal sheet of an electrically conductive material, particularly a metal (e.g., copper), whereby said film is applied in a planar manner to the support, e.g., by welding, embossing, or gluing.

As an alternative to this, the sensor electrode can be formed also by an electrically conductive coating applied to the support. A layer that was applied, differently from a film, not in a solid state but in an originally liquid or gaseous state to the surface of the support and solidified there is designated hereby as a "coating." In expedient process variants, said coating can be produced in this regard, for example, by plasma coating, vapor deposition, sputtering, or flame spraying.

Again as an alternative to this, the sensor electrode within the scope of the invention can also be formed by an electrically conductive plastic region of the support, therefore an electrically conductive partial volume of the support. To create the electrical conductivity, a conductive granular material, particularly a metal powder (e.g., copper powder) or a carbon powder, can be mixed locally into the plastic material of the support.

In an embodiment, the actuator to be operated by the control device is a map pocket light, i.e., one or more lamps (particularly in the form of light-emitting diodes), which light the interior of a map pocket recessed in the inside door panel. The associated electrode is here attached particularly in such a way to the door module that in the mounted state it is closely adjacent to an inside wall of the map pocket. The hand of a vehicle user is then detected by the so arranged sensor electrode, when the hand is inserted into the map pocket. The control device comprising the sensor electrode is hereby preferably formed as a capacitive proximity sensor, which measures the change, caused by the approach of the hand, of the electrical capacitance created between the sensor electrode and ground, and in the case of a sufficient deviation in the measured capacitance from a predetermined target value turns on the map pocket light for a specific time period.

In a further embodiment of the invention, the actuator to be operated by the control device is a servo motor for adjusting an interior and exterior mirror. The sensor electrode assigned to this control device is preferably arranged in such a way on the door module that the sensor electrode aligns at least approximately with an operating surface marked on a front side or inside of the inside door panel. The side of the inside door panel that faces the vehicle interior in the installed state (with a closed door) is designated as the front side or inner side. The operating surface here can be stitched on, in the case of an inside door panel with a leather or textile front surface. Further, the operating surface can also be imprinted and emphasized visually by a different color or a different material, or in some other way from the surrounding area.

The operating surface marked in such a way together with the concealed sensor electrode, disposed behind the surface, simulates a switch, which, however, in contrast to a conventional, electromechanical switch manages with no movable parts and thus has a low level of wear.

The sensor electrode detects the approach of a finger of a vehicle user, whereby the control device again preferably utilizes a capacitive detection principle. Preferably, the control device, provided for adjusting an interior or exterior mirror, comprises a plurality of sensor electrodes, each of which is assigned to one of a number of adjustment directions of the mirror. Optionally, the control device can comprise further sensor electrodes, by means of which a selection can be made between mirrors to be adjusted differently (e.g., left exterior mirror, right exterior mirror, and rear-view mirror).

In a further embodiment, the actuator to be operated by the control device is a window lifter drive. This is in particular the window lifter drive that is integrated in the same door module as the sensor electrode. In addition or alternatively, however, a window lifter drive of another door module, and accordingly a different vehicle door, can be controlled by the control device as well.

The control device provided for controlling the window lifter drive unit comprises preferably two sensor electrodes per window lifter drive to be controlled; each of the electrodes is assigned a different motion direction ("raise," "lower"). Preferably, eight sensor electrodes, which enable control of all four window lifters of the motor vehicle in both motion directions, are provided at least in the door module for the driver's door of a motor vehicle. The or each control electrode of the control device is hereby in turn preferably attached to the door module in such a way that it aligns with a corresponding, marked operating surface on the front side of the inside door panel. This variant of the control device is also preferably formed in the manner of a capacitive proximity sensor.

In order to improve detection accuracy, the sensor electrode can be flanked optionally by at least one shielding electrode. The shielding electrode hereby with respect to its surface area can be arranged parallel to the sensor electrode, whereby the sensor electrode is preferably separated galvanically from the shielding electrode by an electrical isolating lacquer layer. The shielding electrode in this embodiment is preferably arranged between the door module and the sensor electrode. Alternatively, the shielding electrode can also be arranged on the back side, facing away from the vehicle interior in the mounted state, of the door module, so that the door module is surrounded sandwich-like between the sensor electrode and the shielding electrode. To this end, in addition or alternatively, a shielding electrode arranged laterally next to the sensor electrode can also be provided. The shielding electrode in this case is formed particularly in such a way that it surrounds the sensor electrode like a ring or at least on three sides.

The, or each shielding electrode is kept by the control device preferably either at ground potential or at a potential carried along with the potential of the sensor electrode.

In an embodiment, the control device comprises, in addition to the at least one sensor electrode, a control unit which is connected to the or to each sensor electrode and is configured to control the actuator as a function of a sensor signal of the sensor electrode. The control unit preferably comprises a microcontroller with a control program, implemented by software therein, for evaluating the sensor signal and for controlling the actuator as a function of the evaluation result.

The control unit is expediently attached to the same door module to which also the or each assigned sensor electrode is attached. This makes it possible in particular to preassemble (particularly to wire and to test) the control device (which comprises the or each sensor electrode and the control unit) even with the prefabrication of the door module.

In a both simple to produce and wear-resistant embodiment variant, the sensor electrode with the associated control unit is "wired" (i.e., connected conductively) preferably via a strip conductor which is integrated in the support. Any of the methods described in connection with the sensor electrode can be used for the production of the strip conductor. In particular, the strip conductor is made integrally with the associated sensor electrode.

In an embodiment, a plurality of control devices each with assigned sensor electrodes for controlling a plurality of actuators is arranged on the door module. Thus, particularly a first sensor electrode of a first capacitive or inductive control device for the non-contact operation of a first actuator in the motor vehicle, and at least one second sensor electrode of a second capacitive or inductive control device for the non-contact operation of a second actuator in the motor vehicle are provided on the support of the door module. In order to utilize the available hardware resources synergetically, and thereby to minimize both the weight as well as the power consumption and production costs, a single common control unit is assigned to a number of these control devices in an expedient embodiment. It is provided in particular that all sensor elements, which are attached to the support and, for example, can be used partly for operating the window lifter drive and partly for controlling the map pocket light, are connected to the window lifter control as a common control unit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
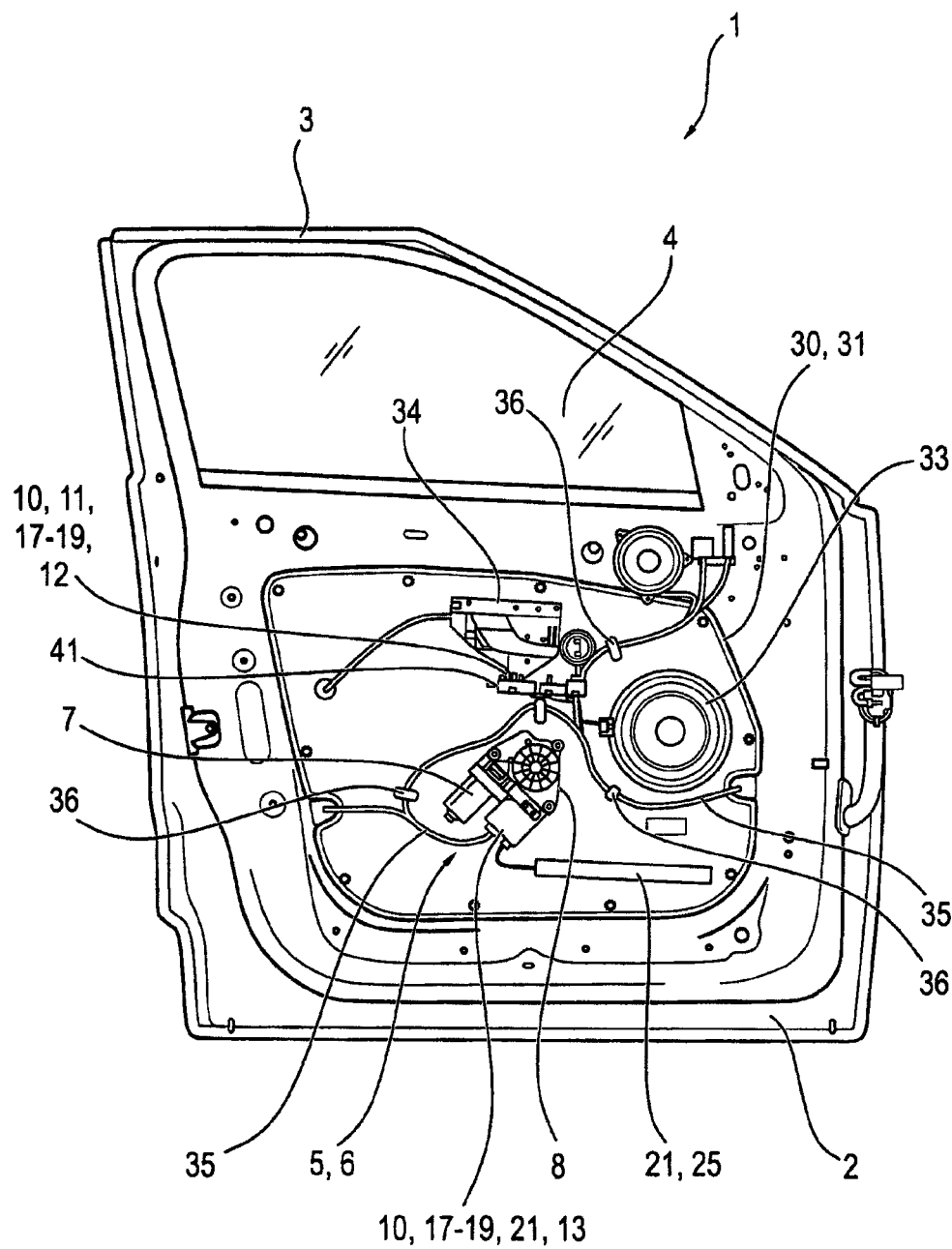
FIG. 1 shows in a plan view the inner side (i.e., the side facing the vehicle interior with the door closed) of a (side) door of a motor vehicle, with a door body and a door module attached thereto, the inside door panel having been taken off.

FIG. 1 shows a (side) door 1 of a motor vehicle, which is, for example, the driver's door of the motor vehicle. Door 1 comprises a door body 2 made of profile panels welded together and also forming the outer skin of door 1. A (window) pane 4, which can be moved in a conventional manner in the vertical direction reversibly between a raised closed position and a lowered open position, is inserted in a window frame 3 of door body 2.

Door 1 is provided with an electrical window lifter 5 for automatically moving pane 4 between the open position and the closed position. Window lifter 5 comprises a (window lifter) drive 6, which comprises for its part an electric motor 7 with reduction gears 8 connected upstream. Window lifter 5 is a cable window lifter customary per se, in which drive 6 acts via a cable on pane 4. The cable (not visible in FIG. 1) in this case is coupled via a winding drum with the drive side of reduction gears 8 and via followers with pane 4.

A control device 10 is integrated in door 1 to control window lifter drive 6.

Control device 10 is made as a capacitive proximity sensor for the non-contact operation of window lifter drive 6. It comprises two command initiators, formed in each case by a sensor electrode 11 and 12, and a control unit 13, which is configured to detect the actuating signals generated via sensor electrodes 11 and 12 and accordingly to activate window lifter drive 6. The two sensor electrodes 11 and 12 generate actuating signals for moving pane 4 in different motion directions ("raise" and "lower"). Specifically, a vehicle user can generate a "raise signal" via sensor electrode 11, based on which control unit 13 causes drive 6 to raise pane 4. Likewise, a "lower signal" can be provided via sensor electrode 12, based on which control unit 13 activates drive 6 to lower pane 4.

Control unit 13 is substantially formed by a microcontroller, whose functionality is implemented by software in the form of a control program 14. As is evident from FIG. 1, control unit 13 is attached to a drive housing of drive 6.

Figure 2:
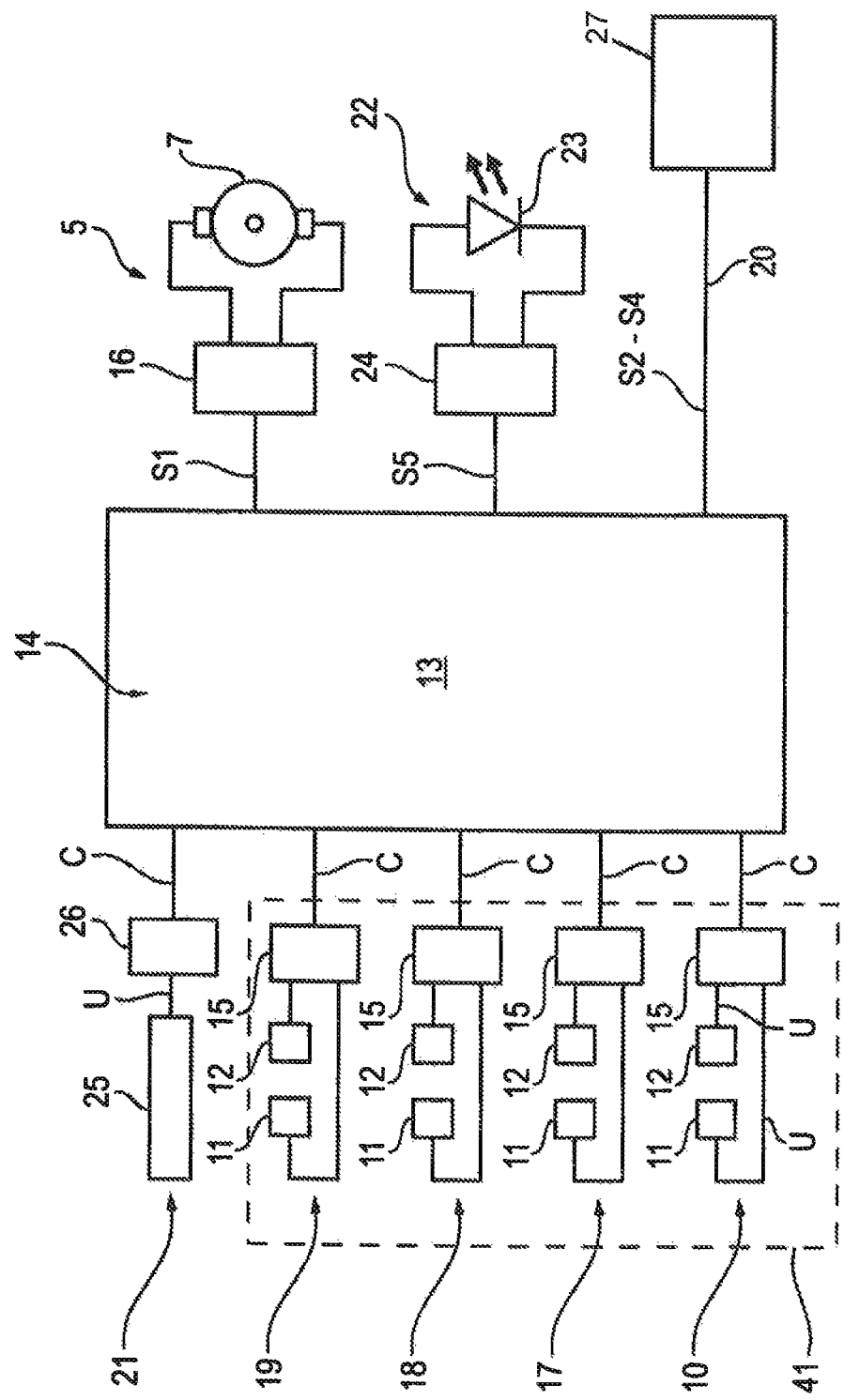
FIG. 2 is a schematic block diagram that shows five control devices, integrated in the door module according to FIG. 1, for the non-contact operation of the four window lifters of the motor vehicle or for the non-contact operation of a map pocket light, whereby the five control devices share a common control unit.

During operation of control device 10, control unit 13 according to FIG. 2 via a driver circuit 15 connected upstream applies an electrical AC voltage U at sensor electrodes 11 and 12, under the action of which an electric field forms in a space in front of sensor electrodes 11 and 12. Between each of sensor electrodes 11 or 12, on the one hand, and ground, on the other, in each case an electrical capacitor is formed, whose electrical capacitance is determined by driver circuit 15. Driver circuit 15 hereby conducts a (capacitance) measured signal C, proportional to the measured capacitance, to control unit 13.

The two sensor electrodes 11 and 12 are here preferably in the time-multiplexed mode, i.e., operated alternating in time, so that at each point in time only the electric field emanating either from sensor electrode 11 or from sensor electrode 12 is present, as a result of which the capacitances of sensor electrodes 11 and 12 (versus ground) can be measured decoupled from one another.

The function of control unit 10 is based on the physical effect that when human body tissue is introduced into the electric field, the capacitance formed between the respective sensor electrode 11 or 12 and ground is significantly influenced. In particular, the approach of a finger of a vehicle user to the specific sensor electrode 11 or 12 causes a significant increase in the capacitance value measurable at the specific sensor electrode 11 or 12, and a corresponding change in the measured signal C output by driver circuit 15. The measured signal C is compared with stored threshold values by control program 14 implemented in control unit 13. Control unit 13 by outputting a control signal S1 to a motor driver 16 upstream of electric motor 7 and by the corresponding operation of electric motor 7 hereby causes the raising or lowering of pane 4, when the respective threshold value is exceeded.

In addition to control device 10, further control devices 17, 18, and 19 are integrated in door 1. These further control devices 17 to 19 are used to control in each case another window lifter, each of which is assigned to another door of the motor vehicle. Each further control device 17 to 19 comprises, in the same way as control device 10, in each case a sensor electrode 11 for generating a raise signal and a sensor electrode 12 for generating a lower signal. Each of control devices 17 to 19 comprises further, likewise in the same way as control device 10, a driver circuit 15 connected to the associated sensor electrodes 11 and 12. Driver circuits 15 of control device 17 to 19 are hereby connected to control unit 13 and in each case supply a measured capacitance signal C to control unit 13, whereby said unit based on the measured capacitance signal C, in the same way as in the case of control device 10, decides about raising or lowering the specifically assigned pane. Corresponding control signals S2 to S4 are output by control unit 13 via a bus 20 (for example, a so-called CAN bus) to one or more actuators 27, such as the motor driver of the affected further window lifter and/or a servo motor for adjusting an interior and exterior mirror.

As is evident from FIG. 2, in addition a further control device 21, which is used to control a map pocket light 22, is integrated in door 1. Map pocket light 22 is formed by a group of light-emitting diodes 23 (of which for reasons of simplicity only one light-emitting diode 23 is shown in FIG. 2) and by a diode driver 24 connected upstream of light-emitting diodes 23.

Control device 21 provided for controlling map pocket light 22 is also formed as a capacitive proximity sensor. Accordingly, control device 21 comprises a sensor electrode 25 with a driver circuit 26 connected upstream, which with respect to design and function corresponds substantially to driver circuits 15. Driver circuit 26, like driver circuits 15, is also connected to control unit 13 to supply the (capacitance)

measured value C. Control devices 10, 17, to 19 and 21 thus share the common control unit 13.

Within the scope of control device 21 as well, control unit 13 compares the measured capacitance value C supplied by driver circuit 26 with a stored threshold value and turns on map pocket light 22, by outputting a corresponding control signal S5 to diode driver 24 for a preset period of time, if the threshold value is exceeded.

In addition to the above-described control devices 10, 17 to 19 and 21, further control devices may be provided in door 1, particularly control devices for the automatic adjustment of interior and/or exterior mirrors of the motor vehicle. The optionally present further control devices also utilize preferably control unit 13 of window lifter 5 as a common control unit.

In order to enable a simplified assembly of door 1, at least most of the functional components of door 1, particularly therefore control devices 10, 17 to 19 and 21 with common control unit 13, window lifter 5, and map pocket light 22, are integrated into a door module 30, which is preassembled as a whole away from the motor vehicle and connected to door body 2 by means of clip connections, welding, or in some other manner only during the final assembly of the motor vehicle.

Figure 3:
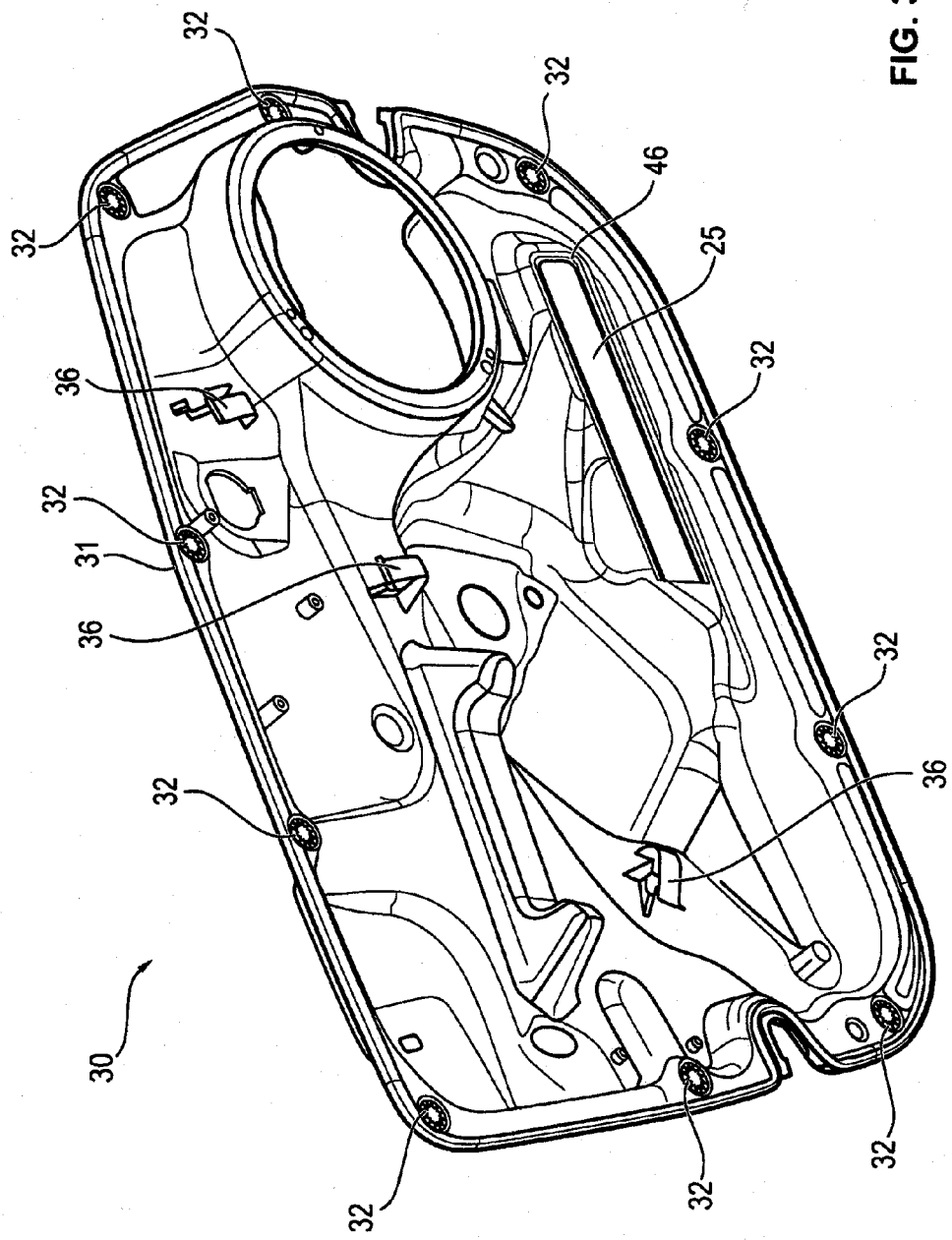
FIG. 3 is a perspective illustration that shows a support of the door module according to FIG. 1.

The central component of said door module 30 is a flat, profiled support 31, which is formed preferably by a large injection-molded part made of plastic. Support 31 again shown isolated in FIG. 3 is provided on its perimeter with a number of fixing points 32, at which support 31 can be fixed to door body 2.

Furthermore, fixing elements (particularly leadthroughs and screw bosses) are provided on support 31 at which in the assembled state window lifter drive 6 and sensor electrodes 11, 12, and 25 are fixed. In addition to these functional components, in particular an onboard loudspeaker 33 and an interior door handle 34 are fixed to support 31. Interior door handle 34, however, can also be fixed alternatively to the inside door panel.

The functional components fixed to support 31 are preferably already contacted electrically with supply and signal lines 35 during the pre-assembly. In the exemplary embodiment according to FIGS. 1 to 5, these supply and signal lines 35 are formed by customary (wire) conductors separated from support 31. To enable a defined cable guiding, in this case cable guiding elements 36 in the shape of hooks and/or loops are formed onto support 31.

Figure 4:
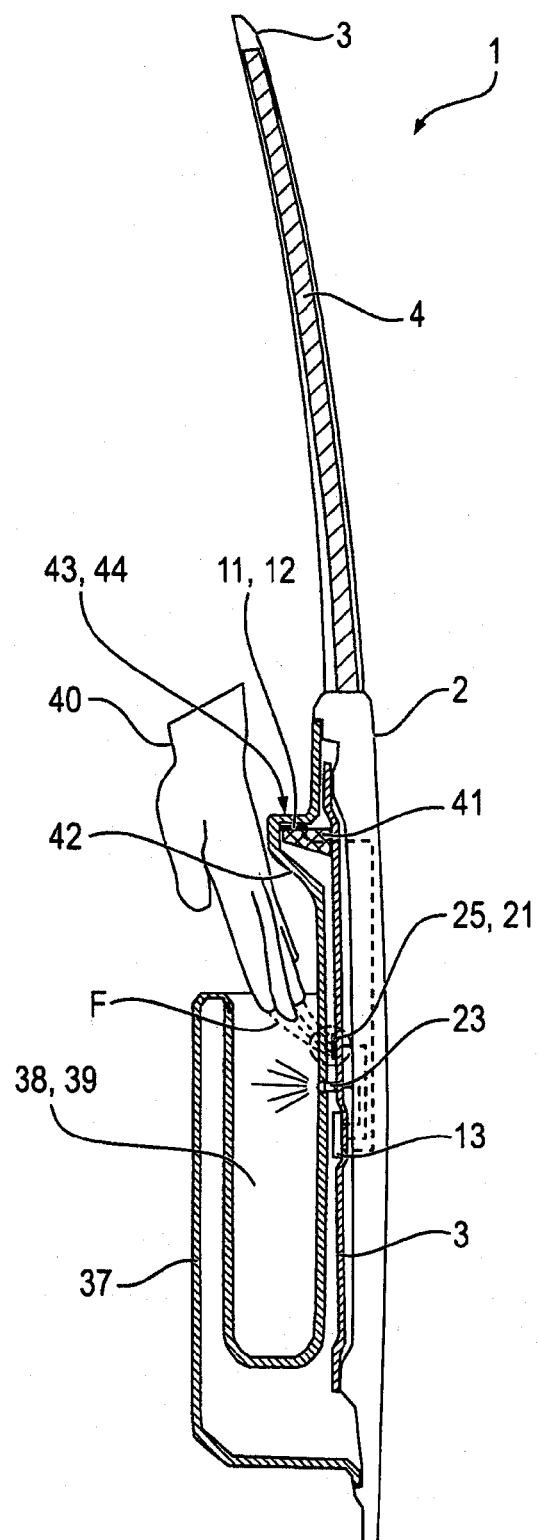
FIG. 4 is a simplified schematic cross section that shows the door according to FIG. 1 with the door module, fixed to the door body, and with an inside door panel which is arranged in front of the door module on the vehicle interior side and in which a map pocket is formed.
Figure 5:
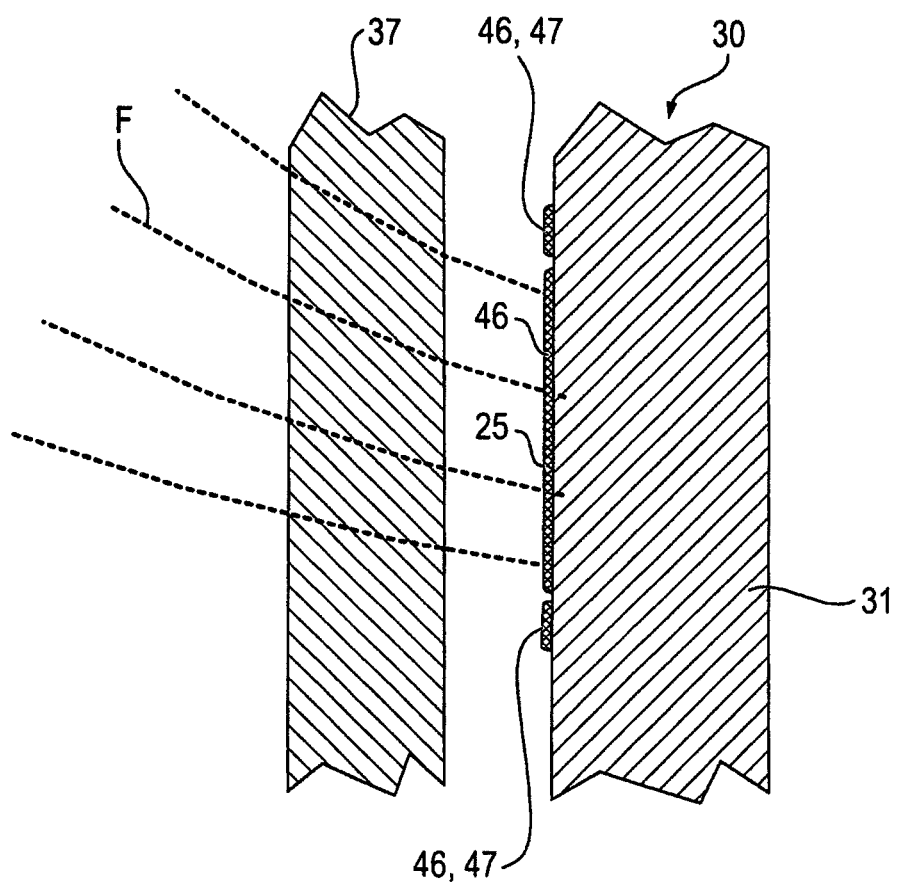
FIG. 5 is in an enlarged section V according to FIG. 4 shows the support of the door module with a sensor electrode, integrated therein, of the control device provided for operating the map pocket light.

FIG. 4 shows door 1 in a schematically simplified illustration in a partial sectional view. It is especially evident from this illustration that an inside door panel 37 is arranged on the inside in front of door body 2 and door module 30 fixed thereto. It is further evident from FIG. 4 that inside door panel 37 in a bottom area is shaped into a map pocket 38 is shown overly large (for technical reasons). Light-emitting diodes 23 are attached there to support 31 of door module 30 in such a way that they are arranged in the area of an opening or a window in an area, forming the interior wall of map pocket 38, of inside door panel 37 and in the turned-on state through this opening or this window illuminate an interior space 39 of the map pocket. The associated sensor electrode 25 of control device 21 is attached to support 31 in such a way that it flanks the interior space 39 of map pocket 38 and detects a hand 40 of a vehicle user when it is inserted into interior space 39. Thus, map pocket light 22 is turned on when the vehicle user inserts hand 40 into map pocket 38. Alternatively, light-emitting diodes 23 can also be fixed to the inside door panel.

Sensor electrodes 11 and 12 of control devices 10 and 17 to 19 are arranged on the top side of a control block 41, which projects inwardly from an inner surface of support 31 (i.e., in the assembled stated in the direction of the vehicle interior). Control block 41 can be formed optionally integrally with support 31 or, as shown in FIG. 4, fabricated as a separate part, which is connected to support 31, for example, by a screw connection.

As is evident from FIG. 4, control block 41 projects into a corresponding convexity 42 of inside door panel 37, so that sensor electrodes 11 and 12 in each case lie closely below a top side 43 of convexity 42. In each case, an operating surface (hereafter: control area 44), marked by a contrasting color and/or by a printed control icon (for example, an arrow), is placed on top side 43 of convexity 42 in alignment with each of sensor electrodes 11 and 12. Each control area 44 hereby provides the vehicle user with an indication of the position of the assigned sensor electrode 11 or 12. Control area 44 and the assigned sensor electrodes 11 and 12 are matched in such a way with respect to position and size that the vehicle user by bringing a finger close to the particular control area 44 can activate the assigned sensor electrode 11 or 12 to generate an operation command.

In the exemplary embodiment shown in FIGS. 1 to 5, sensor electrode 25 of control device 21 is formed by a metal film, which is glued in a planar manner to the inside of support 31. It is evident from FIGS. 2 and 5 that sensor electrode 25 is flanked by a shielding electrode 47, which surrounds sensor electrode 25 from three sides at a small distance. Shielding electrode 47 is hereby set by control unit 13 to a ground potential or to some other potential different from potential of sensor electrode 25 in order to shield sensor electrode 25 from interfering effects.

Sensor electrodes 11 and 12 of control devices 10 and 17 to 19 are also formed in the same way as sensor electrode 25 (optionally with or without assigned shielding electrodes).

Figure 6:
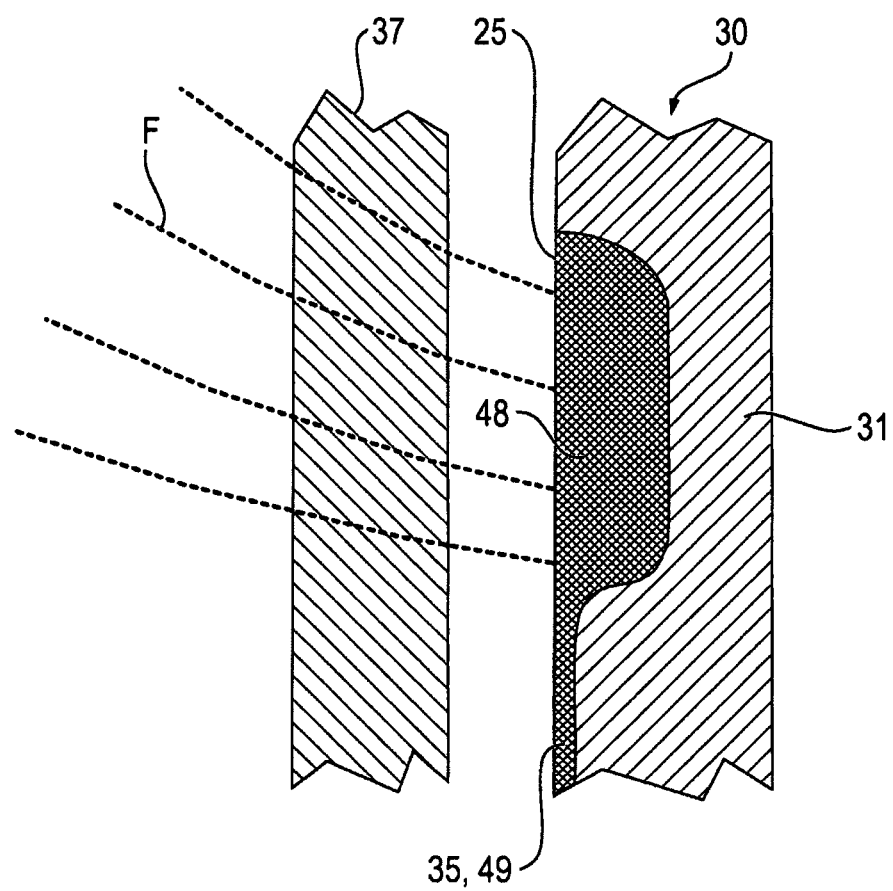
FIG. 6 in an illustration according to FIG. 5 shows the support with an alternatively designed sensor electrode.

In an alternative embodiment of door module 30 shown in FIG. 6, sensor electrode 25 is formed by a conductive plastic region 48, which is embedded in support 31. Said plastic region 48 is formed in particular by the local addition of metal powder to the plastic material of support 31.

The exemplary embodiment according to FIG. 6 differs from the previously described exemplary embodiment further in that the supply and signal lines 35 are not formed by wire conductors (cables), but by strip connectors 49 of electrically conductive plastic, embedded in the material of support 31. Here the supply and signal lines 35 are made integrally with support 31. Instead of a conductive plastic, strip conductors 49 however could be formed by metal film strips glued onto support 31 or connected to it in some other manner or by a local coating of the support surface with a conductive material.

The invention is not [limited] by the previously described exemplary embodiments. Rather, other embodiments of the invention can be derived by the person skilled in the art from the foregoing descriptions. In particular, the individual features of the two previously described exemplary embodiments can also be combined in some other manner within the scope of the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A door module for a door of a motor vehicle, the door module comprising:

a support for receiving a window lifter drive;
fixing points at which the door module is fixable to the corresponding door; and
at least one sensor electrode of a capacitive or inductive control device for non-contact operation of an actuator in the motor vehicle is attached to or inserted in the support,
wherein the door module is provided between an outside door panel and an inside door panel of the door,
wherein the at least one sensor electrode of the capacitive or inductive control device is operable over the inside door panel in a non-contact manner, and
wherein the at least one sensor electrode of the capacitive or inductive control device is activated via non-contact detection of a hand or a finger of a vehicle user inside the motor vehicle.

2. The door module according to claim 1, wherein the sensor electrode is formed by a film of an electrically conductive material, which is applied in a planar manner to the support.

3. The door module according to claim 1, wherein the sensor electrode is formed by a conductive coating applied to the support.

4. The door module according to claim 1, wherein the sensor electrode is formed by an electrically conductive plastic region of the support.

5. The door module according to claim 1, wherein the actuator to be operated by the control device is a map pocket light.

6. The door module according to claim 1, wherein the actuator to be operated by the control device is a servo motor for adjusting an interior or exterior mirror.

7. The door module according to claim 1, wherein the actuator to be operated by the control device is a window lifter drive.

8. The door module according to claim 1, wherein the sensor electrode is flanked at least in sections by a shielding electrode attached to the support.

9. The door module according to claim 1, wherein the control device comprises a control unit connected to the sensor electrode and attached to the support for controlling the actuator as a function of a sensor signal of the sensor electrode.

10. The door module according to claim 9, wherein the sensor electrode is connected to the control unit via a strip conductor integrated in the support.

11. The door module according to claim 9, wherein the capacitive or inductive control device includes a first capacitive or inductive control device and a second capacitive or inductive control device, and a first sensor electrode of the first capacitive or inductive control device for the non-contact operation of a first actuator in the motor vehicle, and at least one second sensor electrode of the second capacitive or inductive control device for the non-contact operation of a second actuator in the motor vehicle are attached to the support, and wherein the first control device and the second control device share a common control unit.

* * * * *

UNITED STATES PATENT AND TRADEMARK OFFICE
CERTIFICATE OF CORRECTION

| | | |
|---|---|---|
| PATENT NO. | : 8,966,825 B2 | Page 1 of 1 |
| APPLICATION NO. | : 14/184981 | |
| DATED | : March 3, 2015 | |
| INVENTOR(S) | : Uebelein et al. | |

It is certified that error appears in the above-identified patent and that said Letters Patent is hereby corrected as shown below:

Title page, item (72)

It shows:

(72) Inventors: Joerg Uebelein, Grub am Forst (DE);
Oscar Mauricio Ayala Guzman, Curitiba (BR);
Christian Thomann, Burgebrach (DE);
Christian Hermann, Coburg (DE)

It should show:

(72) Inventors: Joerg Uebelein, Grub am Forst (DE);
Oscar Mauricio Ayala Guzman, Curitiba (BR);
Christian Thomann, Burgebrach (DE);
Christian Herrmann, Coburg (DE)

Signed and Sealed this
Ninth Day of June, 2015

Michelle K. Lee
*Director of the United States Patent and Trademark Office*